(12) United States Patent
Reits

(10) Patent No.: US 6,229,999 B1
(45) Date of Patent: May 8, 2001

(54) RECEIVER SYSTEM

(75) Inventor: Bernard Jozef Reits, Hengelo (NL)

(73) Assignee: Hollandse Signaalapparaten B.V., Hengelo (NE)

( * ) Notice: Subject to any disclaimer, the term of this patent is extended or adjusted under 35 U.S.C. 154(b) by 0 days.

(21) Appl. No.: 09/050,983

(22) Filed: Mar. 31, 1998

(30) Foreign Application Priority Data

Apr. 22, 1997 (NL) .................................................. 1005865

(51) Int. Cl.[7] .................................................. H04B 1/18
(52) U.S. Cl. .................. 455/280; 455/80; 455/272; 342/27; 342/28
(58) Field of Search .................. 342/27, 28, 21; 455/214, 229, 303, 341, 80, 81, 271, 272, 280, 281

(56) References Cited

U.S. PATENT DOCUMENTS

| | | | |
|---|---|---|---|
| 5,361,070 | * 11/1994 | McEwan | 342/21 |
| 5,428,830 | * 6/1995 | Zerod et al. | 455/282 |
| 5,457,394 | * 10/1995 | McEwan | 324/642 |
| 5,521,600 | * 5/1996 | McEwan | 342/27 |
| 5,640,168 | * 6/1997 | Heger et al. | 343/786 |
| 5,966,090 | * 10/1999 | McEwan | 342/27 |

* cited by examiner

Primary Examiner—Lee Nguyen
(74) Attorney, Agent, or Firm—Oblon, Spivak, McClelland, Maier & Neustadt, P.C.

(57) ABSTRACT

The invention relates to a receiver system for the reception of a series of ultrashort, pulsed electromagnetic signals. Signals of this type usually require an extremely fast-acting receiver, necessarily situated in close proximity to the antenna. According to the invention, the presence of several passive components near the antenna will suffice.

11 Claims, 3 Drawing Sheets

RECEIVER SYSTEM

BACKGROUND OF THE INVENTION

1. Field of the Invention

The invention relates to a receiver system for the reception of a series of ultrashort pulsed electromagnetic signals, comprising at least one antenna, connection means, at least one sample switch, at least one sample capacitor and an amplifier circuit.

2. Discussion of the Background

Such a receiver system is known from the U.S. Pat. No. specification U.S. Pat. No. 5,375,200. The receiver system described in this patent specification constitutes part of a low-budget radar system in which a radar transmitter, an antenna and the receiver system are implemented as an integrated system, the distance between the antenna and the receiver being practically negligible. For more sophisticated applications it may be advantageous to maintain a certain distance between the receiver and the antenna. In case of ship-mounted applications, the receiver is preferably housed below deck, whereas the antenna naturally requires an elevated position. In this situation, received ultrashort signals would have to be passed, for instance via a cable, from the antenna to the receiver. This is undesirable, because pulse attenuation and pulse widening inevitably occur during this transport, with the added risk of electromagnetic interference.

SUMMARY OF THE INVENTION

The receiver system according to the invention does not have this drawback and is characterized in that the sample switch is connected between the at least one antenna and the at least one sample capacitor, the connection means constituting a galvanic connection between the at least one sample capacitor and the amplifier circuit. By thus integrating the sample switch with the antenna, the maximum feasible range resolution can be realized with the transport of relatively low-frequency signals.

An advantageous embodiment of the receiver system according to the invention is characterized in that the at least one sample switch comprises a switching diode and that a galvanic control input is provided for the bringing into conduction, by means of an electric sample pulse, of the at least one switching diode for the sampling of an antenna signal.

Because the electric sample pulse, too, is ultrashort, it may be difficult to transport this pulse over a relatively long distance. A further advantageous embodiment is thereto characterized in that the switching diode is provided with an optical control input for the bringing into conduction, by means of an optical sample pulse, of the at least one switching diode for the sampling of an antenna signal. Optical sample pulses are known for their capacity to be transported over long distances without any substantial pulse widening or pulse attenuation, the transport being moreover impervious to electromagnetic interference.

An extremely advantageous embodiment of the receiver system according to the invention is characterized in that the antenna comprises at least one dipole antenna with two terminals, each of which is connected, via a switching diode, to a sample capacitor. Apart from featuring a satisfactory common mode interference suppression, this embodiment has the advantage that the antenna diagram is known and reproducible. In this embodiment the connection means comprise at least two galvanic connections, which connect both sample capacitors to the amplifier circuit. As is customary, these connection means are incorporated in a preferably common earthed housing in order to suppress electromagnetic interference.

A further advantageous embodiment of the invention is characterized in that the connection means comprise at least two galvanic connections and that the sample capacitors are both connected, via a resistor and a galvanic connection, to the amplifier circuit. The integration of the resistors in the antenna yields an antenna module that produces a current that is proportional to the field intensity measured by the antenna during the presence of the sample pulse and whose output current can easily be combined with output currents of other modules. This is of particular relevance if an antenna diagram with an enhanced directivity is to be realized. With a view to increasing the directivity, a number of dipoles can be combined in a manner known in the art, although this requires expensive RF combination systems. An extremely advantageous embodiment of the invention is, however, characterized in that the antenna comprises an array of dipole antennas in which each dipole is provided with a first switching diode and a second switching diode, connected to a first sample capacitor and a second sample capacitor respectively, and in which the connection means comprise a first galvanic connection to which the first sample capacitors are connected, each via a resistor, and a second galvanic connection to which the second sample capacitors are connected, each via a resistor, the first and the second galvanic connection being connected to the amplifier circuit. Thus, the amplifier circuit can add the current generated per dipole antenna in order to realize the desired level of directivity.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

DETAILED DESCRIPTION OF THE PREFERRED EMBODIMENTS

Figure 1A:
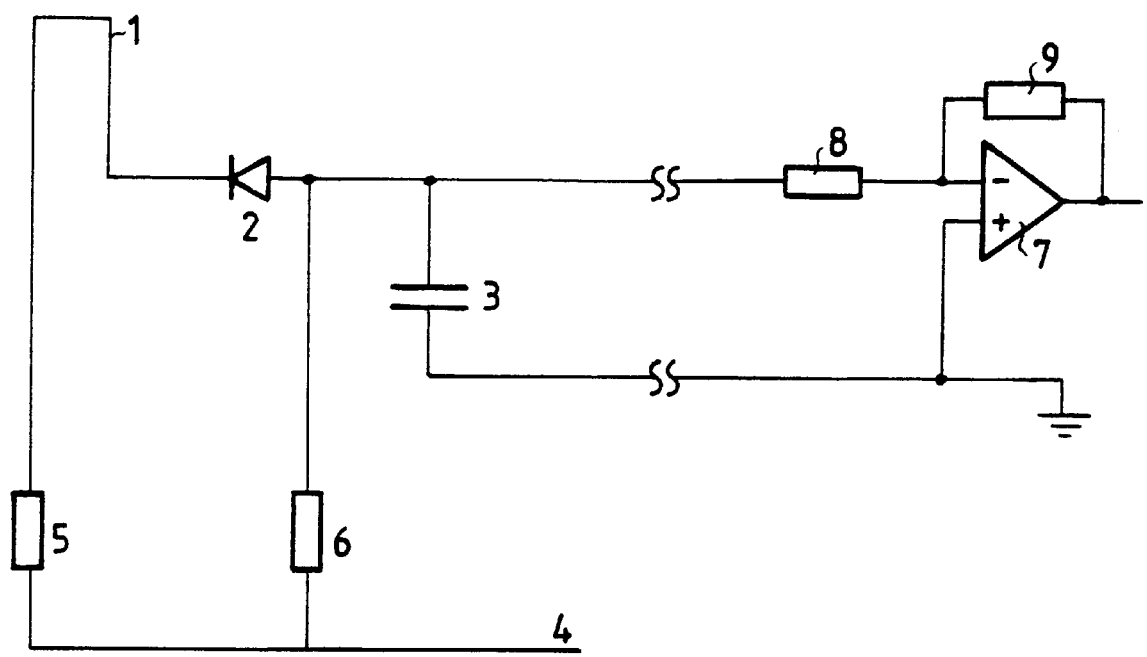
Figure 1B:
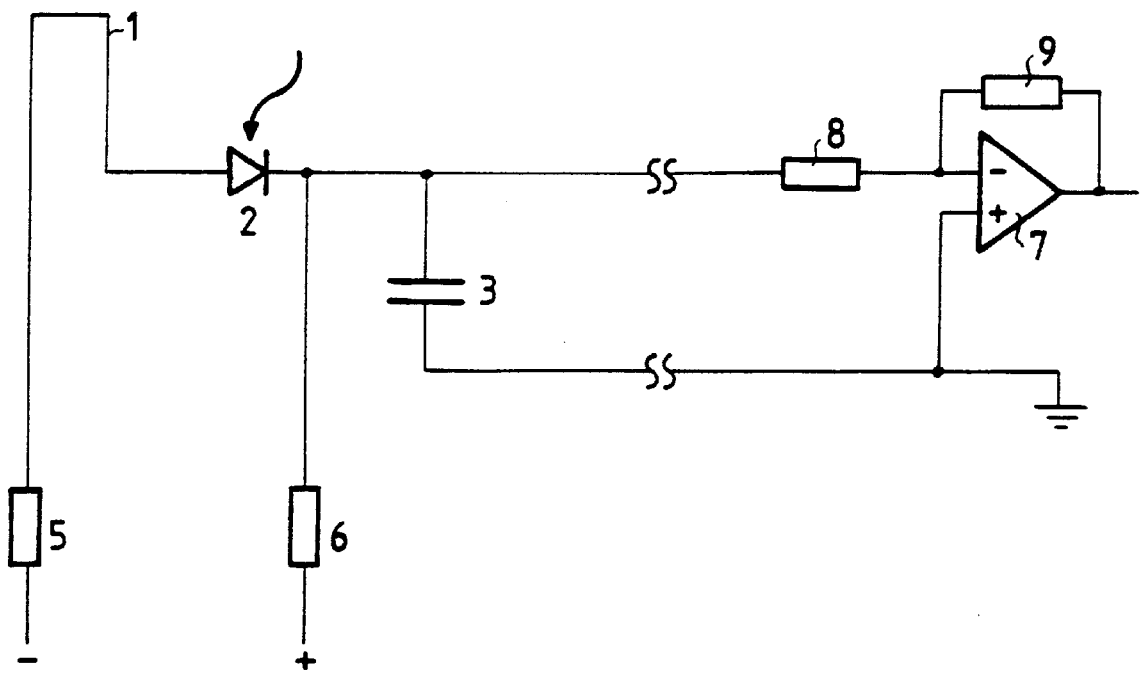
Figure 2A:
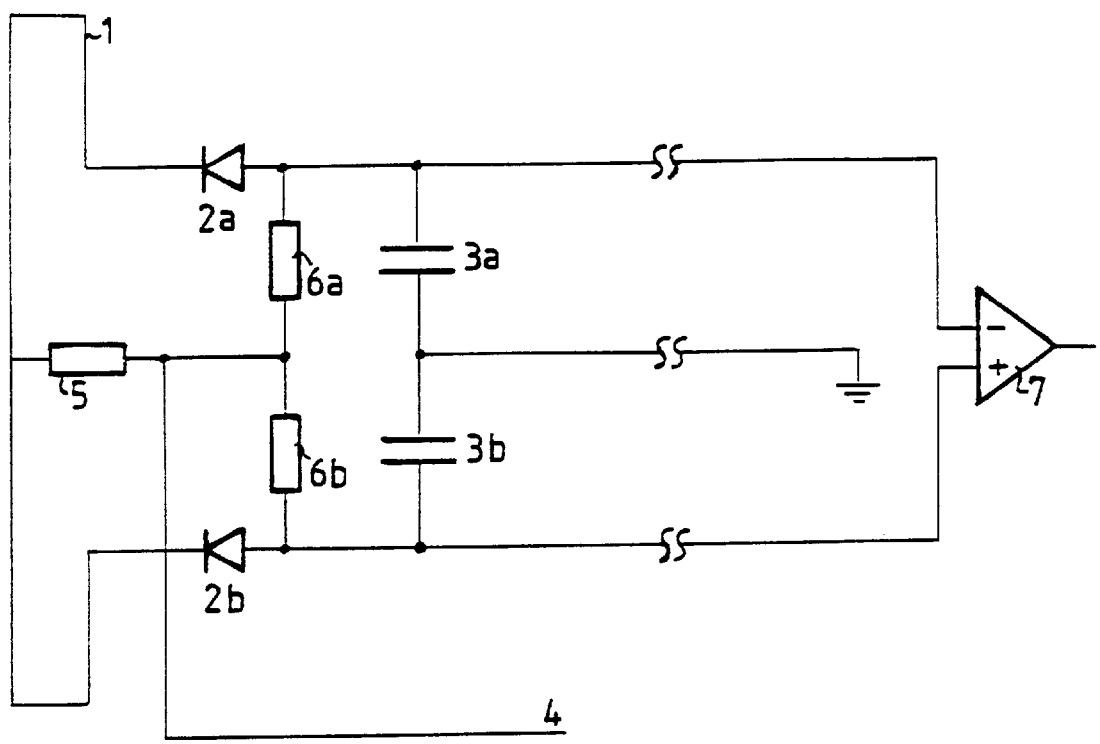
Figure 2B:
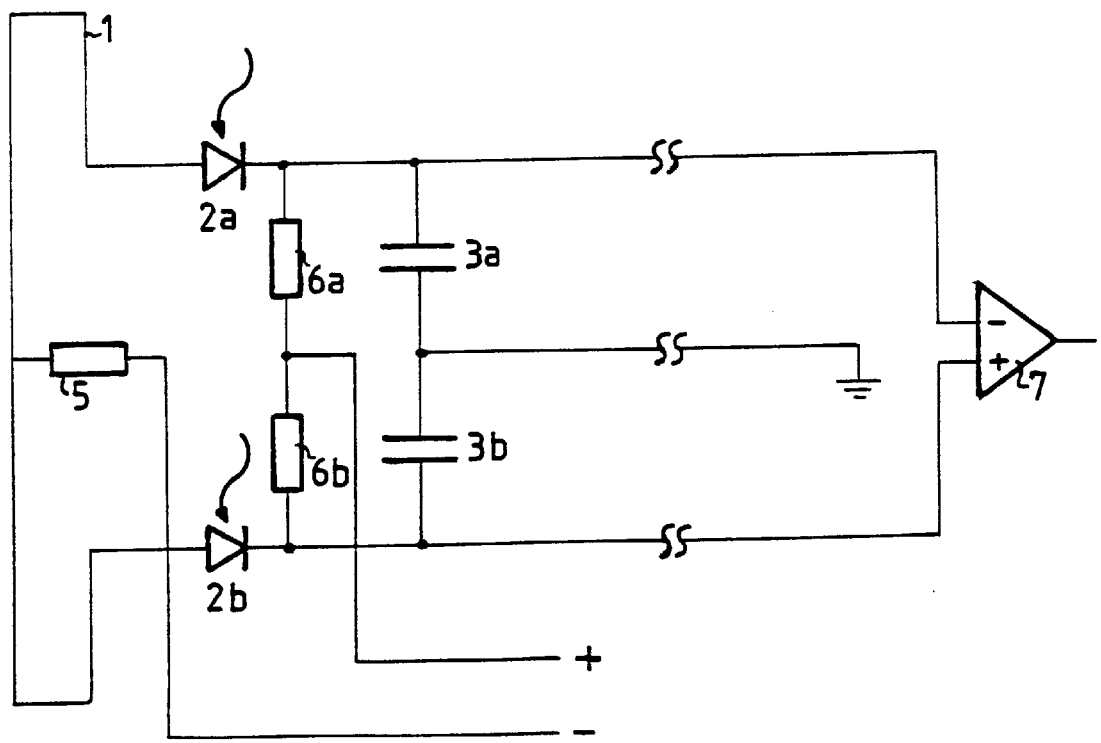
Figure 3:
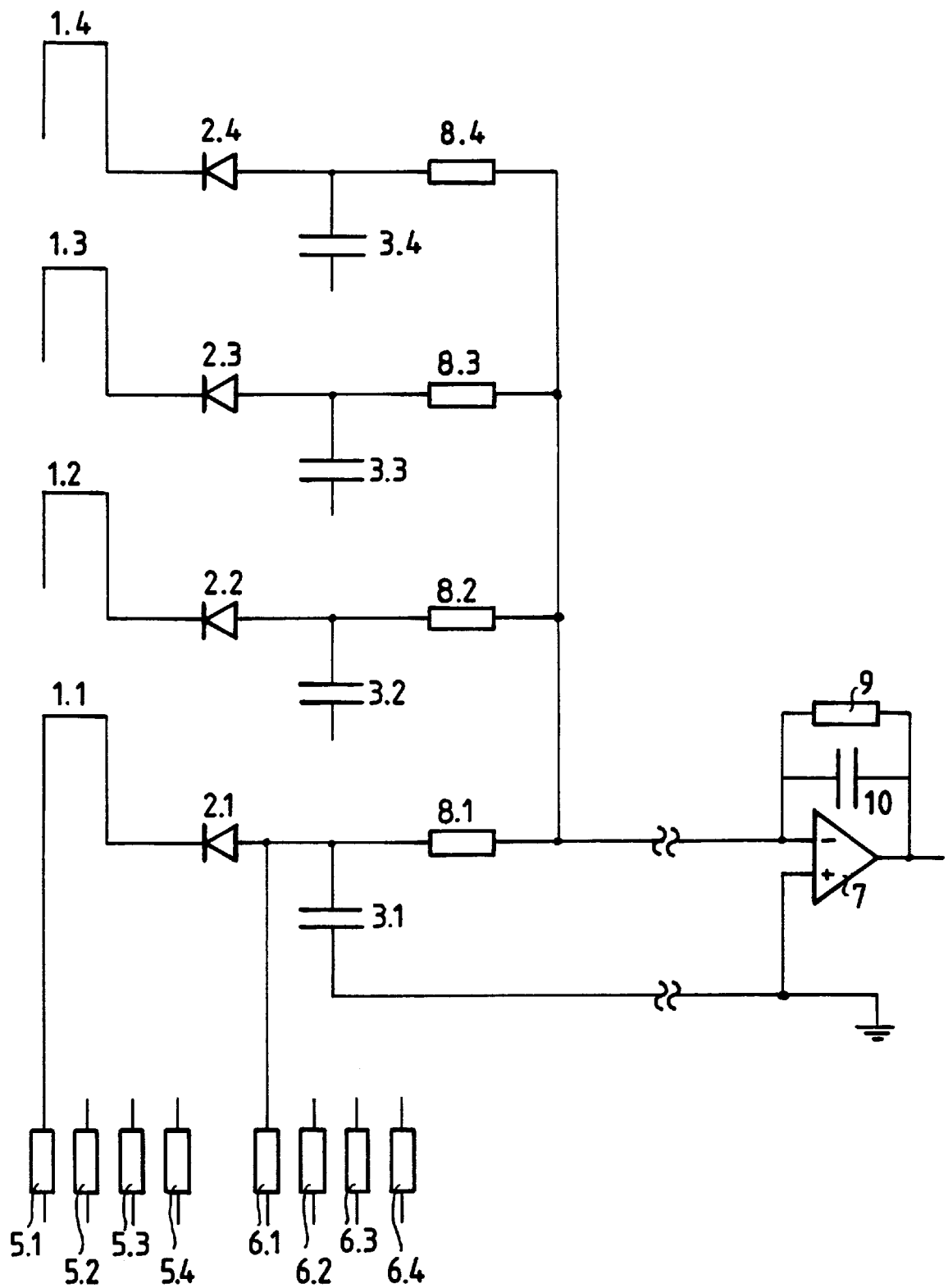

FIG. 1A represents an elementary receiver system with galvanic control;

FIG. 1B represents an elementary receiver system with optical control;

FIG. 2A represents a balanced receiver system with galvanic control;

FIG. 2B represents a balanced receiver system with optical control;

FIG. 3 represents an elementary receiver system incorporating four antennas and galvanic control.

Referring now to the drawings, wherein like reference numerals designate identical or corresponding parts throughout the several views, FIG. 1A represents an elementary receiver system according to the invention in which a loop antenna 1 supplies energy to a sample capacitor 3 via a sample switch designed as a switching diode 2. Besides a switching diode, also other fast-acting solid-state switches may be considered, for instance transistors or FET-switches. Loop antenna 1 receives ultrashort electromagnetic signals which are periodically generated in a transmitter (not shown) with a repetition frequency of for instance 1 MHz. The signals may be received directly or after reflection from an object to be observed. It is essential that, in addition to an ultrashort transmitter pulse, the transmitter also generates an ultrashort reference pulse to activate the receiver system. This may be accomplished by applying the reference pulse to a reference input 4 which supplies the reference pulse, via a resistor 5 and a loop antenna 1, to a switching diode 2. Reference input 4 is, via a resistor 6, also connected to sample capacitor 3. In this embodiment, reference input 4 is kept at a constant positive voltage, for instance +1 volt, as a result of which sample capacitor 3 is charged. During the presence of the reference pulse, reference input 4 is however briefly set at a negative voltage, e.g. −10 volt which results in a brief discharge of sample capacitor 3. If the duty cycle of the reference pulse is moreover known, resistors 5, 6 can be chosen such that sample capacitor 3 accumulates substantially no voltage. If, during the presence of each reference pulse, antenna 1 receives a signal, the charge of sample capacitor 3 will further increase or decrease at each reference pulse, during which process sample capacitor 3 acts as integrative element and an ultrashort electromagnetic signal can thus be detected.

It should be noted that a voltage across sample capacitor 3 is of a low-frequency nature and is therefore easily transportable. The voltage can be applied, for instance via a coaxial cable, to an amplifier 7 which, in this embodiment, is an operational amplifier implemented as voltage amplifier by means of an input resistor 8 and a feedback resistor 9.

Thus, antenna 1 provided with merely a few passive components, is capable of converting the ultrashort signals into signals which can easily be processed and transported, without any loss of information.

Resistors 5, 6 may alternatively be connected by means of two separate wires, whereby resistor 6 is connected to a fixed positive voltage and a negative reference pulse is supplied to resistor 5, for instance via an extremely wideband low-loss coaxial cable. A further possibility is to replace the coaxial cable by a light conductor. This requires the reference pulse to be converted into an ultrashort light pulse, for instance using a solid-state laser. By means of a fast-acting photo-sensitive diode, this light pulse is at antenna 1 converted into an electric signal which is subsequently fed to resistor 5.

FIG. 1B likewise represents an elementary receiver system according to the invention in which switching diode 2 can be directly brought into conduction by means of a light pulse. Switching diodes of this type are frequently used in telecommunications for the reception of digital messages via a light conductor. In this embodiment, sample capacitor 3 is continuously charged, via resistor, 6 by a positive voltage connected thereto and is periodically, i.e. during the occurrence of a sample pulse, discharged via resistor 5 which for that purpose is connected to a negative voltage. Switching diode 2 is blocked in the quiescent state and resumes conduction when provided with a light pulse by a light conductor not shown in the figure. The light pulse shall be so powerful that the discharge current is at least substantially determined by the value of resistor 5 and the negative voltage connected thereto. In that case, a voltage generated by antenna 1 during the occurrence of the light pulse jointly determines the discharge current, thus enabling the detection of a series of ultrashort pulses. This embodiment is preeminently suited for applications where the distance between the antenna and amplifier 7 is relatively large and the presence of active components in or near the antenna is undesirable.

FIG. 2A represents a balanced receiver system according to the invention in which a dipole antenna 1 supplies energy to sample capacitors via two sample switches shaped as switching diodes 2a, 2b. Dipole antenna 1 periodically receives ultrashort electromagnetic signals which, at the two connections of dipole antenna 1, generate two signals in phase opposition. If, exactly simultaneously with these ultrashort signals, a reference pulse is applied to reference input 4, the sample capacitors will, entirely analogously to the circuit described with reference to FIG. 1A, receive different charges, so that the related charge voltages will vary in a mutually opposite sense. Sample capacitors 3a, 3b are connected to a differential amplifier 7 which indicates this potential difference, at least after the reception of a number of ultrashort pulses. In this respect, sample capacitors 3a, 3b also act as integrative elements.

FIG. 2B likewise represents a balanced receiver system according to the invention in which the switching diodes 2a, 2b are directly brought into conduction via light pulses, fully analogous to the circuit described with reference to FIG. 1B. Upon the reception of an electromagnetic signal, coincident with the light pulse, mutually opposite voltages will again be built up in sample capacitors 3a, 3b, which potential difference can again be indicated by means of a remotely positioned differential amplifier 7. For switching the switching diodes 2a, 2b, use can generally be made of one single light conductor which is split near to the antenna by means of a prior art splitter for connection to both diodes.

FIG. 3 represents an elementary receiver system with an array of four antennas 1.1, 1.2, 1.3, 1.4. In this arrangement, sample diodes 2.i can be connected via resistor 5.i; sample capacitors 3.i can be charged via resistor 6.i, fully analogous to the circuit described with reference to FIG. 1a (i=1, . . . ,4). The charges accumulated by means of sample capacitors 3.i are summed via resistors 8.i and applied to operation amplifier 7 which, by means of resistor 9 and capacitor 10, is implemented as integrator. This embodiment aims at enhancing the directivity of the antenna, which entirely consists of passive components. To this end, the four dipoles 1.i are for instance arranged in a row in order to obtain an enhanced directivity in one direction. If an ultrashort electromagnetic signal is received from a direction perpendicular to the row, equal electric voltages will simultaneously be induced in all four antennas. If this coincides with the moment that the reference pulse brings the diodes 2.i into conduction, these voltages will be integrated by amplifier 7 and will contribute to the output voltage. If the ultrashort electromagnetic signal comes from another direction, an electric voltage will be induced in at most one antenna.

A receiver system incorporating an array of antennas can of course also be realized by means of an optical control. It will then usually be sufficient to pass the optical signal, for instance generated by means of a solid-state laser, to the antenna array via a light conductor and to distribute the signal by means of splitters to the switching diodes corresponding to the antennas. It is of importance, though, to choose the path lengths of the split light conductors to be equal, at least if a direction of reception is required that is perpendicular to the array. If, by contrast, a direction of reception is required that is not perpendicular to the array, this can simply be realized by introducing corresponding path length differences into the split light conductors.

An array of antennas may be unidimensional, if an increased directivity in only one dimension is required or two-dimensional, if directivity is required in two dimensions. The nature of the received signals however precludes the occurrence of grating lobes, which allows the antennas to be placed relatively widely apart. This enables the desired directivity to be realized with a limited number of dipoles.

The above-described embodiments are invariably based on the assumption that the reference pulse for the bringing into conduction of the switching diodes is generated at a predetermined point in time after the occurrence of a pulse from a transmitter (not shown). Thus, in fact only one fixed sample moment is obtained. If the receiver system is to be used as radar receiver, an obvious solution would be to periodically vary this moment, thus creating a desired number of sample moments, or, formulated differently, thus measuring a desired number of range quants.

What is claimed is:

1. A receiver system for receiving a series of ultrashort, pulsed electromagnetic signals, comprising:
   an antenna;
   a sample switch;
   a sample capacitor, wherein the sample switch and the sample capacitor are mounted in a first subunit, and are integrated with the antenna;
   an amplifier circuit mounted in a second subunit that is separate from the first subunit; and
   connection means connecting the first subunit and the separate second subunit.

2. The receiver system as claimed in claim 1, wherein the sample switch comprises a switching diode.

3. A receiver system for receiving a series of ultrashort, pulsed electromagnetic signals, comprising:
   an antenna;
   a sample switch comprising a switching diode and a galvanic control input configured to control the switching diode for the sampling of an antenna signal by means of an electric sample pulse;
   a sample capacitor, wherein the sample switch and the sample capacitor are mounted in a first subunit, and are integrated with the antenna;
   an amplifier circuit mounted in a second subunit that is separate from the first subunit; and
   connection means connecting the first subunit and the separate second subunit.

4. A receiver system for receiving a series of ultrashort, pulsed electromagnetic signals, comprising:
   an antenna;
   a sample switch comprising a switching diode and an optical control input configured to control the switching diode for the sampling of an antenna signal by means of an optical sample pulse;
   a sample capacitor, wherein the sample switch and the sample capacitor are mounted in a first subunit, and are integrated with the antenna;
   an amplifier circuit mounted in a second subunit that is separate from the first subunit; and
   connection means connecting the first subunit and the separate second subunit.

5. The receiver system as claimed in claims 3 or 4, wherein the antenna comprises a dipole antenna with two terminals, the receiver further comprising:
   another sample switch having a switching diode, and
   another sample capacitor connected to one of the terminals via the switching diode of the other sample switch.

6. The receiver system as claimed in claim 5, wherein the connection means comprises at least two galvanic connections which connect the sample capacitors to the amplifier circuit.

7. The receiver system as claimed in claim 5, wherein the connection means comprises at least two galvanic connections and the sample capacitors are both connected, via a resistor and one of the galvanic connections, to the amplifier circuit.

8. The receiver system as claimed in claim 5, wherein the antenna comprises:
   an array of dipole antennas, each dipole being provided with a first switching diode and a second switching diode that are connected to a first sample capacitor and a second sample capacitor respectively, wherein the connection means comprises a first galvanic connection to which the first sample capacitors are connected, each via a resistor, and a second galvanic connection to which the second sample capacitors are connected, each via another resistor, the first and the second galvanic connection being connected to the amplifier circuit.

9. A system for receiving an ultrashort electromagnetic signal, comprising:
   an antenna having a plurality of terminals;
   a sample switch coupled to one of the terminals of the antenna, the sample switch having a control input to control conduction of the sample switch;
   an amplifier circuit remotely located from the antenna; and
   a sample capacitor coupled to the sample switch and configured to detect the ultrashort electromagnetic signal, the sample capacitor outputting a voltage corresponding to the received ultrashort electromagnetic signal to the remote amplifier circuit.

10. The system as in claim 9, wherein the control input of the sample switch is configured to receive electrical signals, the sample switch selectively conducting based upon the received electrical signals.

11. The system as in claim 9, wherein the control input of the sample switch is configured to receive optical signals, the sample switch selectively conducting based upon the received optical signals.

* * * * *